United States Patent
Chae et al.

(10) Patent No.: US 10,185,066 B2
(45) Date of Patent: Jan. 22, 2019

(54) COLOR FILTER AND DISPLAY APPARATUS INCLUDING THE SAME

(71) Applicant: SAMSUNG DISPLAY CO., LTD., Yongin-si, Gyeonggi-do (KR)

(72) Inventors: Kyungtae Chae, Yongin-si (KR); Seungyeon Chae, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/652,686

(22) Filed: Jul. 18, 2017

(65) Prior Publication Data

US 2018/0045866 A1 Feb. 15, 2018

(30) Foreign Application Priority Data

Aug. 11, 2016 (KR) .......................... 10-2016-0102443

(51) Int. Cl.
*G02B 5/20* (2006.01)
*G02B 5/26* (2006.01)
(Continued)

(52) U.S. Cl.
CPC ............... *G02B 5/207* (2013.01); *G02B 5/26* (2013.01); *G02F 1/1336* (2013.01); *G02F 1/133512* (2013.01); *G02F 1/133514* (2013.01); *G02F 1/133516* (2013.01); *G02F 1/133553* (2013.01); *G02F 1/133617* (2013.01); *G03F 7/0007* (2013.01); *H01L 27/322* (2013.01); *G02F 2001/133614* (2013.01);
(Continued)

(58) Field of Classification Search
CPC ...... G02B 5/207; G02B 5/26; G02F 1/133512

USPC .......................................................... 349/106
See application file for complete search history.

(56) References Cited

U.S. PATENT DOCUMENTS

| 2008/0084156 A1* | 4/2008 | Choi | ........................ H01J 1/70 313/496 |
| 2010/0084674 A1* | 4/2010 | Paetzold | ................ B82Y 20/00 257/98 |

(Continued)

FOREIGN PATENT DOCUMENTS

| KR | 10-2013-0140462 A | 12/2013 |
| KR | 10-2014-0074495 A | 6/2014 |

(Continued)

OTHER PUBLICATIONS

Extended European search report issued by the European Patent Office dated Jan. 11, 2018 in the examination of the European Patent Application No. 17185622.2.

*Primary Examiner* — Lucy P Chien

(74) *Attorney, Agent, or Firm* — Lee & Morse, P.C.

(57) ABSTRACT

A color filter includes a substrate, a first color conversion layer, a second color conversion layer, a barrier wall, and a light blocking layer. The substrate includes a first pixel region spaced from a second pixel region. The first color conversion layer is on the first pixel region and converts incident light to light of a first color. The second color conversion layer is on the second pixel region and converts the incident light to light of a second color. The barrier wall is between the first and second color conversion layers over the substrate. The light blocking layer extends continuously on a bottom surface and a side surface of the barrier wall, and the bottom surface faces the substrate.

23 Claims, 12 Drawing Sheets

(51) Int. Cl.
  *G03F 7/00* (2006.01)
  *G09G 3/36* (2006.01)
  *G02F 1/1335* (2006.01)
  *G02F 1/13357* (2006.01)
  *H01L 27/32* (2006.01)
  *G09G 3/3208* (2016.01)

(52) U.S. Cl.
  CPC .... *G02F 2202/108* (2013.01); *G02F 2202/36* (2013.01); *G09G 3/3208* (2013.01); *G09G 3/36* (2013.01)

(56) References Cited

U.S. PATENT DOCUMENTS

| | | |
|---|---|---|
| 2010/0123860 A1 | 5/2010 | Kim et al. |
| 2011/0038070 A1* | 2/2011 | Nakamata .............. G02B 5/201 359/891 |
| 2011/0080629 A1 | 4/2011 | Neuman et al. |
| 2012/0248444 A1 | 10/2012 | Kang et al. |
| 2013/0335799 A1 | 12/2013 | Yoon et al. |
| 2014/0160408 A1 | 6/2014 | Cho et al. |
| 2015/0124188 A1 | 5/2015 | Kadowaki et al. |
| 2015/0285969 A1* | 10/2015 | Kim ....................... G02B 5/201 359/891 |
| 2016/0372528 A1 | 12/2016 | Kamura et al. |

FOREIGN PATENT DOCUMENTS

| | | |
|---|---|---|
| KR | 10-2016-0056335 A | 5/2016 |
| WO | WO 2012/042803 A1 | 4/2012 |
| WO | WO 2015/083823 A1 | 6/2015 |

\* cited by examiner

COLOR FILTER AND DISPLAY APPARATUS INCLUDING THE SAME

CROSS-REFERENCE TO RELATED APPLICATION

Korean Patent Application No. 10-2016-0102443, filed on Aug. 11, 2016, and entitled, "Color Filter and Display Apparatus Including the Same," is incorporated by reference herein in its entirety.

BACKGROUND

1. Field

One or more embodiments relate to a color filter and a display apparatus including a color filter.

2. Description of the Related Art

A liquid crystal display (LCD) is one of the most widely-used displays in the world. An LCD includes a liquid crystal layer between pixel and common electrodes. When a voltage is applied between the pixel and common electrodes, an electric field is generated which controls the orientation of liquid crystal molecules in the liquid crystal layer. An image is formed when backlight passes through the liquid crystal layer.

One type of LCD uses color filters to generate color light. These filters reduce the amount of light in the image by ⅓. Color filters, therefore, reduce light efficiency.

A photo-luminescent liquid crystal display (PL-LCD) has been proposed to compensate for the low light efficiency and increase color reproducibility. A PL-LCD apparatus uses a quantum dot-color conversion layer (QD-CCL) to generate color light, instead of color filters. For example, a color image is formed based on visible light generated when low wavelength band light (such as ultraviolet light or blue light generated from a light source and controlled by a liquid crystal layer) is irradiated onto a color conversion layer (CCL).

The CCL generates light of a wavelength that is different from light emitted from the light source, instead of transmitting light emitted from the light source like a color filter. Also, light emitted from the CCL is irradiated in various directions. Consequently, light emitted from adjacent CCLs of different colors may mix, thereby adversely affecting the reproduction of color in the displayed image.

SUMMARY

In accordance with one or more embodiments, a color filter includes a substrate including a first pixel region spaced from a second pixel region; a first color conversion layer, on the first pixel region, to convert incident light to light of a first color; a second color conversion layer, on the second pixel region, to convert the incident light to light of a second color; a barrier wall between the first and second color conversion layers over the substrate; and a light blocking layer extending continuously on a bottom surface and a side surface of the barrier wall, the bottom surface facing the substrate.

The light blocking layer may include a black matrix layer between the barrier wall and the substrate, and a reflection layer between the barrier wall and the first and second color conversion layers. The reflection layer may include a same material as the black matrix layer and continuously extends from the black matrix layer. The cross-section of the barrier wall may have an inverse-tapered shape, and a width of the inverse-tapered shape may increase in a direction leading away from the substrate.

The first color conversion layer may include first quantum dots to emit the light of the first color when excited by the incident light, and the second color conversion layer may include second quantum dots to emit the light of the second color when excited by the incident light. The first color conversion layer may include first quantum-dot color conversion layer that includes the first quantum dots, and a first color filter layer may reflect the incident light, the first color filter layer between the substrate and the first quantum-dot color conversion layer, and the second color conversion layer may include second quantum-dot color conversion layer that includes the second quantum dots, and second color filter layer may reflect the incident light, the second color filter layer between the substrate and the second quantum-dot color conversion layer.

The first color filter layer may selectively transmit the light of the first color emitted from the first quantum-dot color conversion layer, and the second color filter layer may selectively transmit the light of the second color emitted from the second quantum-dot color conversion layer. The first color conversion layer may include a band-pass filter layer to selectively transmit the incident light, the band-pass filter layer over the first quantum-dot color conversion layer. The incident light may be blue light or ultraviolet light, the first color may be red, and the second color may be green.

The light blocking layer may include a plurality of layers continuously stacked on the bottom surface and the side surface of the barrier wall, a portion of the light blocking layer may be between the substrate and the bottom surface of the barrier wall, and at least one of the layers may include a continuously extended metal layer. The light blocking layer may include a first layer, a second layer on the first layer, and a third layer on the second layer, the first and third layers may include a transparent metal oxide, and the second layer may include a metal.

The substrate may include a third pixel region spaced apart from the first and second pixel regions, and the color filter may include a penetration layer on the third pixel region, the color filter to transmit the incident light. The substrate may include a third pixel region spaced apart from the first and second pixel regions, and the color filter may include a third color conversion layer on the third pixel region, the color filter to convert the incident light to light of a third color. Each of thicknesses of the first and second color conversion layers may be less than or equal to a height from the substrate to a top surface of the barrier wall. The first color conversion layer may include a first quantum-dot color conversion layer including first quantum dots, scattered particles and a photosensitive resin layer, and the first quantum dots and scattered particles may be dispersed in the photosensitive resin layer.

In accordance with one or more other embodiments, a method for manufacturing a color filter includes forming a sacrificial layer exposing a light blocking region between a first pixel region and a second pixel region, the first and second pixel regions spaced from each other over a substrate; forming a reflection material layer over the substrate to cover the light blocking region of the substrate and the sacrificial layer, and forming a trench corresponding to the light blocking region and limited by the reflection material layer; forming an organic material pattern embedding the trench; etching the reflection material layer using the organic material pattern as a mask to expose the sacrificial layer, and forming a reflection layer over the light blocking region of the substrate and a side surface of the sacrificial layer; exposing the first and second pixel regions of the substrate by removing the sacrificial layer; forming, on the first pixel region, a first color conversion layer to convert incident light thereon to light of a first color; and forming, on the second pixel region, a second color conversion layer to convert the incident light thereon to light of a second color.

Forming the first and second color conversion layers may be performed using an inkjet coating method. The method may include forming a barrier wall embedding the trench limited by the reflection layer, wherein forming the barrier wall may include removing part of the organic material pattern. The trench may have a width that increases in a direction leading away from the substrate. Forming the reflection material layer may include continuously stacking a plurality of layers on the substrate.

In accordance with one or more other embodiments, a display apparatus includes a display including first and second pixels; and a color filter over the display and including first and second pixel regions respectively overlapping the first and second pixels, wherein the color filter includes: a substrate including the first and second pixel regions; a first color conversion layer, on the first pixel region of the substrate, to convert incident light to light of a first color; a second color conversion layer, on the second pixel region of the substrate, to convert the incident light to light of a second color; a barrier wall between the first color conversion layer and the second color conversion layer over the substrate; and a light blocking layer extending continuously over a bottom surface of the barrier wall and a side surface of the barrier wall, the bottom surface facing the substrate. The display may include a backlight and a liquid crystal display panel over the backlight. Each of the first and second pixels may include an organic light-emitting device.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
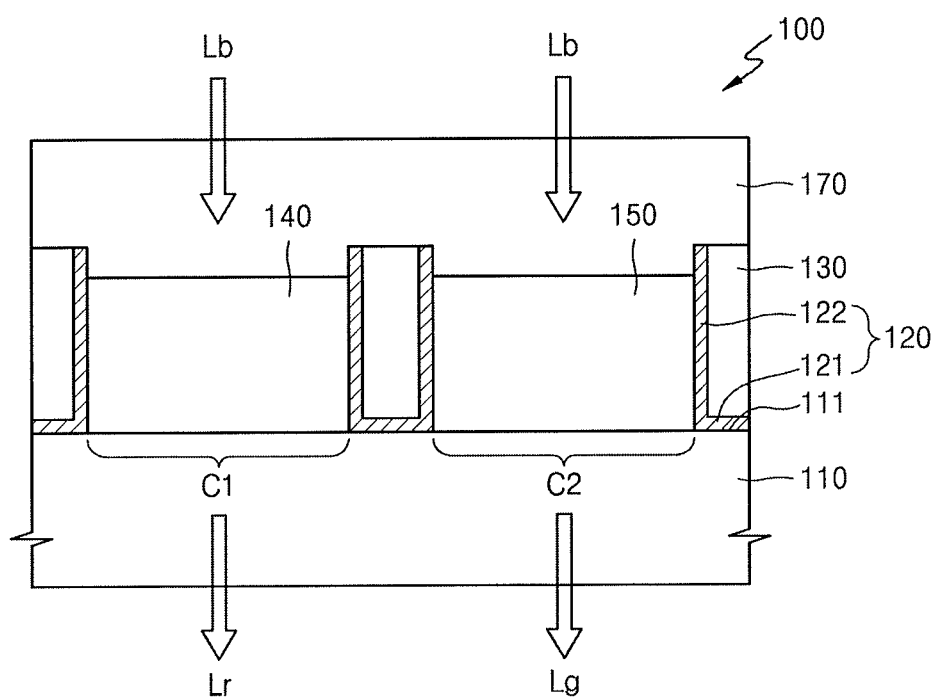
FIG. 1 illustrates an embodiment of a color filter.

Example embodiments will be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates a cross-sectional view of an embodiment of a color filter 100 which includes a substrate 110, a light blocking layer 120, a barrier wall 130, a first color conversion layer 140, and a second color conversion layer 150. The color filter 100 may further include a planarization layer 170.

The substrate 110 has a first pixel region C1 separated from a second pixel region C2. The first color conversion layer 140 is over the first pixel region C1 and converts incident light Lb to light Lr of a first color. The second color conversion layer 150 is over the second pixel region C2 and converts the incident light Lb to a light Lg of a second color. The barrier wall 130 is over the substrate 110 to define the first and second pixel regions C1 and C2. The barrier wall 130 is between the first and second color conversion layers 140 and 150. In one embodiment, the light blocking layer 120 may be continuously formed over a bottom surface of the barrier wall 130, the bottom surface facing the substrate 110, and a side surface of the barrier wall 130.

The substrate 110 is a transparent substrate through which passes the light Lr and the light Lg respectively emitted from the first and second color conversion layers 140 and 150. The substrate 110 may be, for example, an inorganic material transparent substrate including glass or quartz, a plastic transparent material including polyethylene terephthalate, polyethylene naphthalate, polyimide, or polycarbazole, or any type of transparent film.

The substrate 110 has a first surface 111 on which is formed the light blocking layer 120, the barrier wall 130, the first color conversion layer 140, and the second color conversion layer 150. The substrate 110 may have a plurality of pixel regions including the first and second pixel regions C1 and C2. The pixel regions may be spaced apart from each other and arranged in a matrix. The pixel regions may further include a third pixel region C3 (e.g., of FIG. 4) emitting light of a different color from the first and second pixel regions C1 and C2.

The barrier wall 130 is over a light blocking region between the first and second pixel regions C1 and C2 to define the first and second pixel regions C1 and C2. The barrier wall 130 is over the light blocking region between the pixel regions of the substrate 110 and arranged, for example, in a mesh shape over the substrate 110. The barrier wall 130 is between the first and second color conversion layers 140 and 150. A cross-section of the barrier wall 130 may have, for example, a rectangular shape with a uniform width, as in FIG. 1. In one embodiment, the cross-section of the barrier wall 130 may have an inverse-tapered shape having a width that increases in a direction leading away from the substrate 110.

The barrier wall 130 may include an organic material, e.g., polyimide resin, acryl resin, or a resist material. The barrier wall 130 may include a photosensitive organic material, e.g., a photoresist. The barrier wall 130 may be formed, for example, by coating a barrier wall material layer using a wet method (e.g., a slit coating method or a spin coating method) or a dry method (e.g., a chemical vapor deposition method or a vacuum deposition method), and then performing a photo-process on the barrier wall material layer. The barrier wall 130 may include an inorganic material, e.g., silicon oxide, silicon nitride, or tantalum oxide. The material and/or method for forming the barrier wall 130 may be different in another embodiment.

The thickness of the barrier wall 130 (e.g., distance from the first surface 111 of the substrate 110 to a top surface of the barrier wall 130) may be predetermined to prevent a color conversion material from flowing over the first and second pixel regions C1 and C2 while forming the first and second color conversion layers 140 and 150 via an inkjet coating method. The thickness of the barrier wall 130 (e.g., distance from the first surface 111 of the substrate 110 to the top surface of the barrier wall 130) may be equal to or greater than thicknesses of the first and second conversion portions 140 and 150. The barrier wall 130 has a bottom surface facing a bottom surface of the substrate 110 and side surfaces facing the first and second color conversion layers 140 and 150.

The light blocking layer 120 blocks incident light Lb from reaching the substrate 110, blocks light Lr emitted from the first conversion portion 140 from being irradiated to the second color conversion layer 150, and blocks light Lg emitted from the second color conversion layer 150 from being irradiated to the first color conversion layer 140. The light blocking layer 120 may continuously extend over the bottom and side surfaces of the barrier wall 130.

The light blocking layer 120 includes a black matrix layer 121 and a reflection layer 122. The black matrix layer 121 is over the bottom surface of the barrier wall 130 and between the barrier wall 130 and the substrate 110. The reflection layer 122 is over the side surface of the barrier wall 130. The black matrix layer 121 blocks incident light Lb from being emitted to the substrate 110. The reflection layer 122 may increase light efficiency by reflecting light Lr emitted in a side direction from the first color conversion layer 140, and may block light Lr from being irradiated to the second color conversion layer 150. The reflection layer 122 may also increase light efficiency by reflecting light Lg emitted in a side direction from the second color conversion layer, and may block the light Lg from being irradiated to the first color conversion layer 140. The reflection layer 122 may be simultaneously formed with the black matrix layer 121 using the same process and same material as the black matrix layer 121, and may continuously extend from the black matrix layer 121.

The light blocking layer 120 may include a metal layer having high light reflection properties. The metal layer may be a layer including, for example, silver (Ag), magnesium (Mg), aluminum (Al), platinum (Pt), palladium (Pd), gold (Au), nickel (Ni), neodymium (Nd), iridium (Ir), chromium (Cr), an alloy thereof, or a compound thereof. In one embodiment, the light blocking layer 120 may include a layer including Ag. The light blocking layer 120 may have a multi-layer structure of a plurality of layers that are continuously stacked. At least one of the layers may be a metal layer. For example, the light blocking layer 120 may include a transparent metal oxide layer of indium tin oxide (ITO), and an Ag layer. In one embodiment, the light blocking layer 120 may include a first transparent metal oxide layer (e.g., a Ag layer) and a second transparent metal oxide layer, that are continuously stacked on each other.

The first color conversion layer 140 is over the first pixel region C1, and a side surface of the first color conversion layer 140 is surrounded by the barrier wall 130. The first color conversion layer 140 converts incident light Lb to light Lr of the first color.

The second color conversion layer 150 is over the second pixel region C2, and a side surface of the second color conversion layer 150 is surrounded by the barrier wall 130. The second color conversion layer 150 converts incident light Lb to light Lg of the second color. The second color conversion layer 150 may have, for example, a structure similar to the first color conversion layer 140, except for some differences. An embodiment of second color conversion layer 150 will be described based on the differences relative to first color conversion layer 140 in FIG. 2.

According to an embodiment, incident light Lb may be blue light, light Lr of the first color may be red light, and incident light Lg of the second color may be green light. The blue light may be light with a peak wavelength equal to or higher than 400 nm and lower than 495 nm. The green light may be light with a peak wavelength equal to or higher than 495 nm and lower than 580 nm. The red light may be light with a peak wavelength equal to or higher than 580 nm and lower than 750 nm. According to another embodiment, incident light Lb may be ultraviolet (UV) light, for example, with a peak wavelength equal to or higher than 200 nm and lower than 400 nm.

The planarization layer 170 may be over the substrate 110 to cover the light blocking layer 120, the barrier wall 130, the first color conversion layer 140, and the second color conversion layer 150. The planarization layer 170 may be transparent such that incident light Lb is irradiated to the first and second color conversion layers 140 and 150. The planarization layer 170 may include a transparent organic material, e.g., polyimide resin, acryl resin, or resist material. The planarization layer 170 may be formed, for example, using a wet method (e.g., a slit coating method or a spin coating method) or a dry method (e.g., a chemical vapor deposition method or a vacuum deposition method). The material and/or method for forming the planarization layer 170 may be different in another embodiment.

Figure 2:
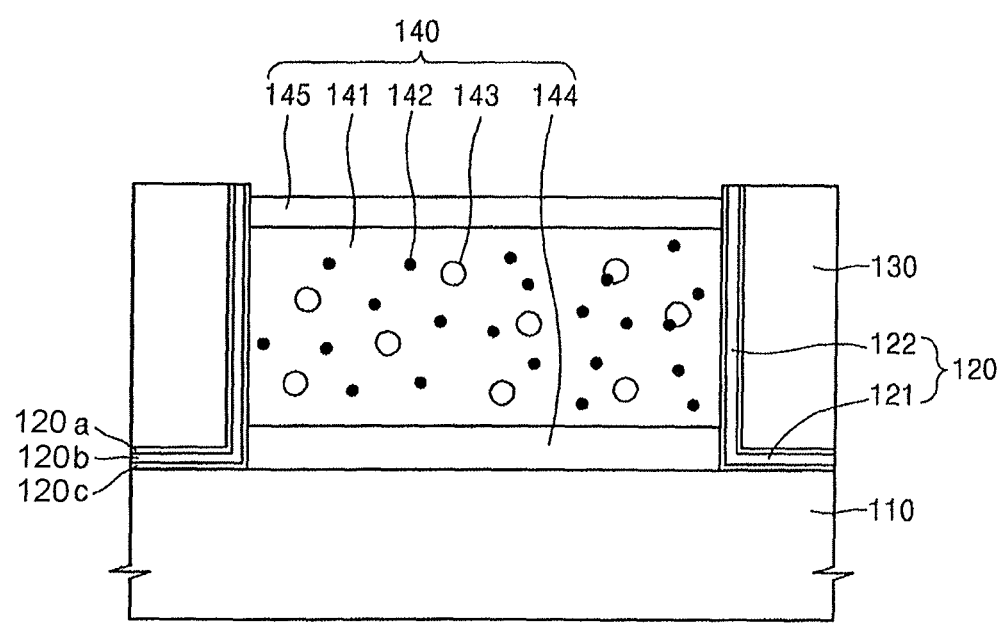
FIG. 2 illustrates an enlarged view of the color filter.

FIG. 2 illustrates an enlarged cross-sectional view an example of a part of the color filter 100 in FIG. 1. Referring to FIG. 2, the light blocking layer 120 may include a first layer 120a, a second layer 120b, and a third layer 120c. The first layer 120a directly surrounds the bottom and side surfaces of the barrier wall 130. The second layer 120b is directly formed on the first layer 120. The third layer 120c is directly formed on the second layer 120b. The third layer 120c is directly formed on a top surface of the substrate 110 and side surfaces of the first and second color conversion layers 140 and 150. The second layer 120b is directly disposed between the first layer 120a and the third layer 120c.

The first layer 120a and the third layer 120c may include, for example, a transparent metal oxide. The second layer 120b may include, for example, a metal having high light reflectivity, e.g., silver (Ag). The materials and/or structure of the first through third layers 120a through 120c may be different in another embodiment.

The first color conversion layer 140 may include a first quantum-dot color conversion layer including photosensitive resin 141 in which quantum dots 143 and scattered particles 142 are dispersed. The quantum dot 143 emits light Lr by being excited by the incident light Lb. The quantum dot 143 may absorb incident light Lb and emit light Lr having a wavelength band longer than a wavelength of incident light Lb.

The quantum dot 143 may include one of nano-crystals from among silicon (Si)-based nano-crystals, II-VI group-based compound semiconductor nano-crystals, III-V group-based compound semiconductor nano-crystals, IV-VI group-based compound semiconductor nano-crystals, or a mixture thereof. The II-VI group-based compound semiconductor nano-crystals may be one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, or HgZnSTe.

The III-V group-based compound semiconductor nano-crystals may be one of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The IV-VI group-based compound semiconductor nano-crystals may be SbTe.

The scattered particle 142 may scatter incident light Lb that is not absorbed by the quantum dot 143, such that more quantum dots 143 are excited by incident light Lb. A color conversion rate of the first quantum-dot color conversion layer may be increased by the scattered particle 142. The scattered particle 142 may be, for example, a titanium oxide ($TiO_2$) or a metal particle.

The photosensitive resin 141 may be silicon resin or epoxy resin, and may have light transmissibility. The first color conversion layer 140 may include a fluorescent substance that converts incident light Lb to light Lr of the first color.

The first color conversion layer 140 may further include a first color filter layer 144 that reflects incident light Lb between the first quantum-dot color conversion layer and the substrate 110. The first color filter layer 144 may reflect incident light Lb such that more quantum dots 143 are excited. Also, the first color filter layer 144 may block incident light Lb from passing through the substrate 110 and being externally emitted, thereby increasing color purity and color reproducibility.

According to an embodiment, the first color filter layer 144 may be a blue light blocking filter. According to another embodiment, the first color filter layer 144 may be a red light transmitting filter that selectively transmits light Lr of the first color. When light Lg of the second color (e.g., green light), is included in the incident light Lb, the first color filter layer 144 may not only block the incident light Lb, but also the light Lg such that the light Lg is not emitted through the first pixel region C1.

The first color conversion layer 140 may include, over the first quantum-dot color conversion layer, a band-pass filter layer 145 that selectively transmits the incident light Lb. When the light Lg is included in the incident light Lb, the light Lg is unable to excite the quantum dots 143 in the first color conversion layer 140 and may be externally emitted through the substrate 110. In this case, not only the light Lr of the first color, but also the light Lg of the second color are emitted. Thus, color purity in the first pixel region C1 may be decreased, thereby reducing color reproducibility. The band-pass filter layer 145 may selectively transmit only the incident light Lb (e.g., blue light), thereby increasing color purity and color reproducibility. The band-pass filter layer 145 may be omitted in another embodiment.

In one embodiment, the second color conversion layer 150 may also include the photosensitive resin 141 in which the quantum dots 143 and the scattered particles 142 are dispersed. A layer including the photosensitive resin 141, in which the quantum dots 143 and the scattered particles 142, are dispersed may be referred to as a second quantum-dot color conversion layer.

The quantum dot 143 in the second color conversion layer 150 emits light Lg of the second color by being excited by the incident light Lb. The quantum dot 143 may absorb the incident light Lb and emit light Lg having a longer wavelength band than the wavelength of the incident light Lb. The quantum dot 143 may include at least one of nano-crystals from among Si-based nano-crystals, II-VI group-based compound semiconductor nano-crystals, III-V group-based compound semiconductor nano-crystals, IV-VI group-based compound semiconductor nano-crystals, or a mixture thereof.

The quantum dot 143 in the second color conversion layer 150 and the quantum dot 143 in the first color conversion layer 140 may include the same material. However, the size of the quantum dot 143 in the second color conversion layer 150 may be different from the size of the quantum dot 143 in the first color conversion layer 140.

When the wavelength of emitted light increases, the size of the quantum dot 143 for sufficiently inducing surface Plasmon resonance tends to increase. Accordingly, since the wavelength of green light is shorter than that of red light, the quantum dot 143 in the second color conversion layer 150 may be smaller than that of the quantum dot 143 in the first color conversion layer 140. Also, the size of the scattered particle 142 may be smaller than the size of the quantum dot 143 in the second color conversion layer 150.

The photosensitive resin 141 and the scattered particle 142 in the second color conversion layer 150 may be the same as the photosensitive resin 141 and the scattered particle 142 in the first color conversion layer 140.

Like the first color conversion layer 140, the second color conversion layer 150 may also include a second color filter layer that reflects incident light Lb between the second quantum-dot color conversion layer and the substrate 110. The second color filter layer may reflect the incident light Lb such that more quantum dots 143 are excited. Also, the second color filter layer may block the incident light Lb from passing through the substrate 110 and being externally emitted, thereby increasing color purity and color reproducibility. The second color filter layer may be a blue light blocking filter.

According to one embodiment, the second color conversion layer 150 may further include green light transmitting filter layer that selectively transmits the light Lg of the second color. The green light transmitting filter layer may be between the second quantum-dot color conversion layer and the substrate 110. When the incident light Lb includes light Lr (e.g., red light), the green light transmitting filter layer may not only block the incident light Lb, but also the light Lr such that the light Lr is not emitted through the second pixel region C2. Like the first color conversion layer 140, the second color conversion layer 150 may also include, over the second quantum-dot color conversion layer, the band-pass filter layer 145 that selectively transmits the incident light Lb.

Figure 3A:
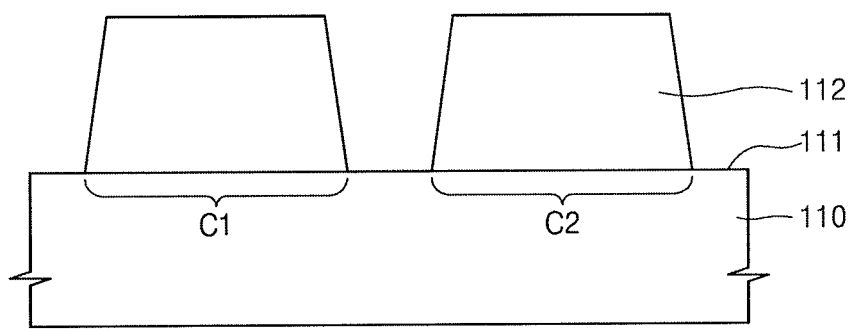
FIGS. 3A to 3E illustrate various stages of an embodiment of a method for manufacturing a color filter.

FIGS. 3A to 3E are cross-sectional views of various stages corresponding to an embodiment of a method for manufacturing a color filter. Referring to FIG. 3A, a sacrificial layer 112 is formed over the first surface 111 of the substrate 110 where the first and second pixel regions C1 and C2 are defined. The sacrificial layer 112 is formed over the first and second pixel regions C1 and C2, and may expose a light blocking region between the first and second pixel regions C1 and C2. The light blocking region may exclude a region from which light is emitted through the substrate 110, e.g., the first and second regions C1 and C2. The light blocking region may be between pixel regions, such as the first and second pixel regions C1 and C2.

The sacrificial layer 112 may include a photosensitive organic material. For example, a photosensitive organic material layer may be coated on the substrate 110, for example, using a slit coating method or a spin coating method. Then, the sacrificial layer 112 exposing the light blocking region of substrate 110 may be formed by performing a photolithographic process.

Figure 3B:
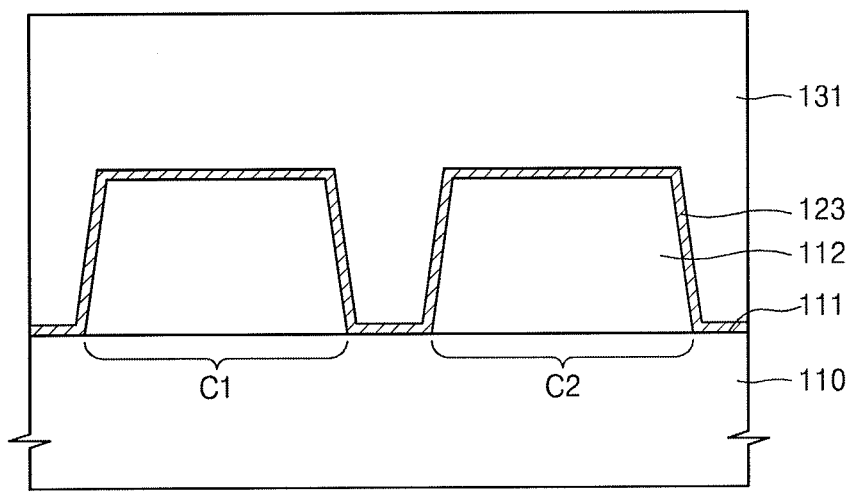

Referring to FIG. 3B, a reflection material layer 123 is formed over the first surface 111 of the substrate 110, to cover the light blocking region of the substrate 110 and the sacrificial layer 112. Since the reflection material layer 123 protrudes over the first surface 111 that is flat, a trench is formed as in FIG. 3B. The trench corresponds to the light blocking region and is limited by the reflection material layer 123. Also, as illustrated in FIG. 3B, the width of the trench may increase away from the substrate 110. Accordingly, as illustrated in FIG. 3E, the cross-section of the barrier wall 130 may have an inverse-tapered shape having a width that increases in a direction away from the substrate 110.

The reflection material layer 123 may include a metal layer having light reflection characteristics. The reflection material layer 123 may have a stacked structure including a plurality of material layers are stacked on each other. In one embodiment, as illustrated in FIG. 2, the reflection material layer 123 may have a three-layer structure of a first transparent metal oxide layer, a metal layer, and a second transparent metal oxide layer that are continuously stacked. The reflection material layer 123 may be formed, for example, by a chemical vapor deposition process.

An organic material layer 131 may be formed over the substrate 110 where the reflection material layer 123 is formed. The organic material layer 131 may include, for example, a photosensitive organic material different from the photosensitive organic material of the sacrificial layer 112. As illustrated in FIG. 3B, the organic material layer 131 may embed the trench limited by the reflection material layer 123.

Figure 3C:
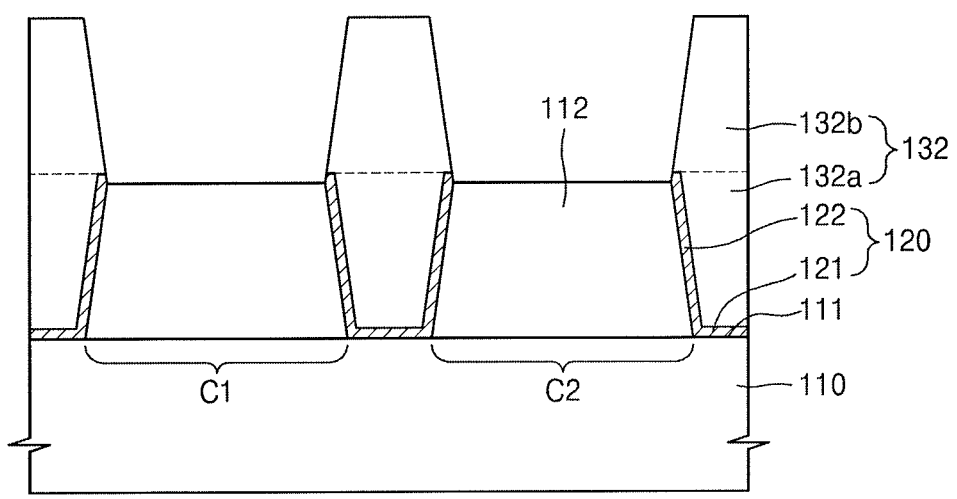

Referring to FIG. 3C, an organic material pattern 132 embedding the trench is formed when a portion of the organic material layer 131 is removed, for example, by a photolithographic process. The organic material pattern 132 may include a first portion 132a embedded by the trench and a second portion 132b protruding outside the trench. A portion of the reflection material layer 123 over the sacrificial layer 112 may be exposed. A boundary between the first and second portions 132a and 132b may be on the same plane as an upper surface of the portion of the reflection material layer 123, which is located over the sacrificial layer 112.

The portion of the reflection material layer 123 may be removed by using the organic material pattern 132 as an etch mask. Accordingly, the sacrificial layer 112 is exposed. A portion of the reflection material layer 123, which is not removed, is referred to as the light blocking layer 120. The light blocking layer 120 is provided over the light blocking region of the substrate 110 and a side surface of the sacrificial layer 112.

Figure 3D:
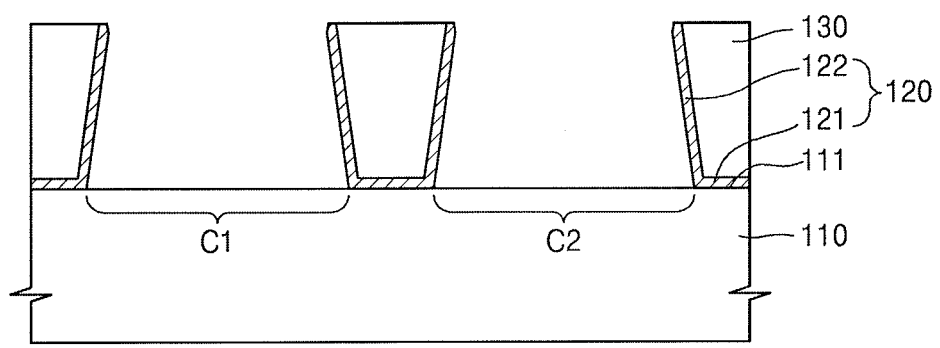
Figure 3E:
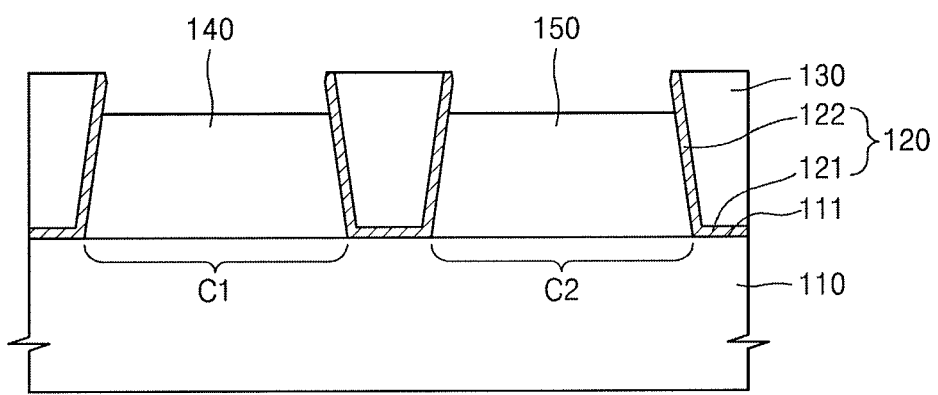

Referring to FIG. 3D, the exposed sacrificial layer 112 is removed. Accordingly, as illustrated in FIG. 3B, the first and second pixel regions C1 and C2 of the substrate 110 are exposed. Also, the second portion 132b of the organic material pattern 132 is removed and only the first portion 132a embedded by the trench may remain. The first portion 132a may also be referred to as the barrier wall 130. The barrier wall 130 in FIG. 3D may have a flat upper surface and a height that is equal to the highest portion of the light blocking layer 120. In one embodiment, an upper surface of the barrier wall 130 may not be flat, e.g., may be concave or convex or another shape.

Referring to FIG. 3E, the first color conversion layer 140 may be formed in a space, limited by the barrier wall 130 and the light blocking layer 120, over the first pixel region C1. The first color conversion layer 140 may be formed, for example, using an inkjet coating method. Heights of the barrier wall 130 and the light blocking layer 120 may be designed such that the color conversion layer 140 does not flow over an adjacent pixel region (e.g., second pixel region C2) when the first color conversion layer 140 is formed using the inkjet coating method.

Referring again to FIG. 2, the first color conversion layer 140 may include the first color filter layer 144. According to an embodiment, the first quantum-dot color conversion layer may be formed after the first color filter layer 144 is formed over the first pixel region C1 of the substrate 110 of FIG. 3D. According to one embodiment, the first color filter layer 144 may be formed over the first pixel region C1 before the sacrificial layer 112 is formed over the substrate 110.

Like the first color conversion layer 140, the second color conversion layer 150 may also be formed in a space limited by the barrier wall 144 and the light blocking layer 120, over the second pixel region C2. The second color conversion layer 150 may also be formed, for example, using an inkjet coating method.

Since the first and second color conversion layers 140 and 150 are formed using an inkjet coating method, a photo-process may not be additionally performed. Thus, manufacturing costs may be reduced and processes may be simplified.

Figure 4:
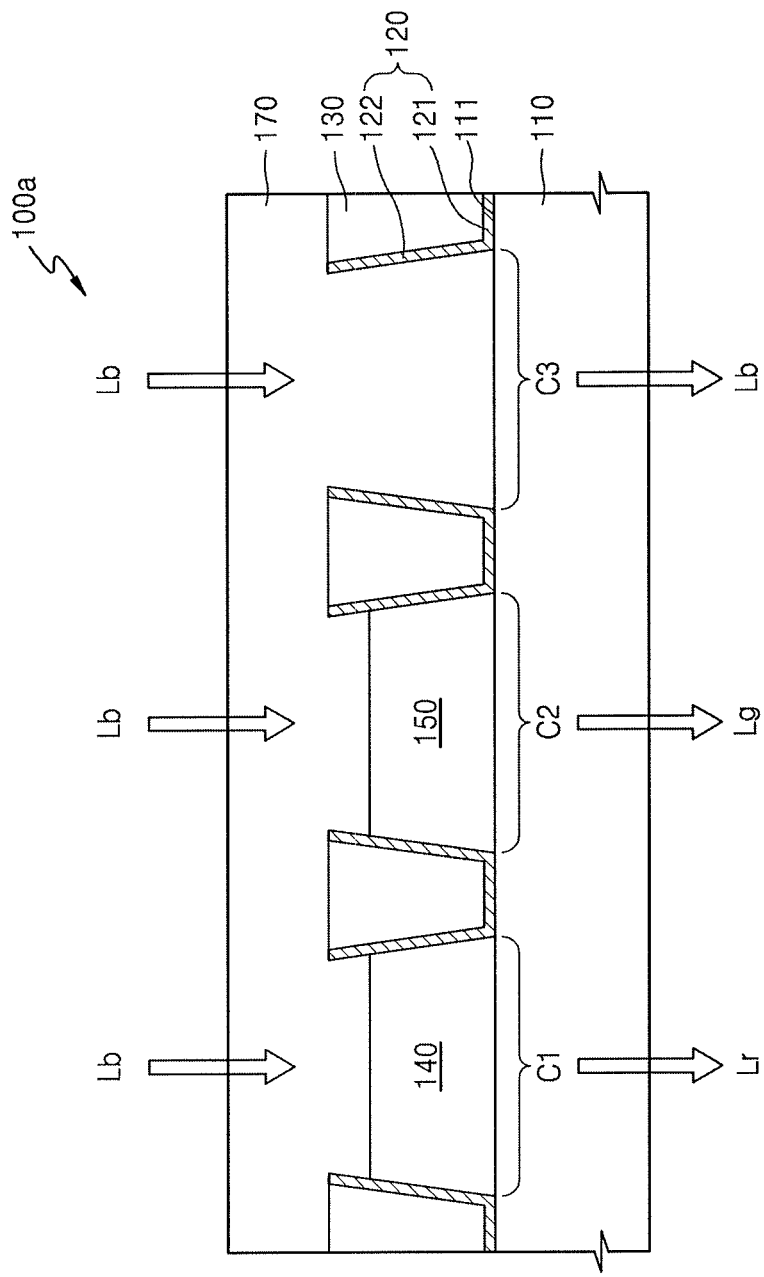
FIG. 4 illustrates another embodiment of a color filter.

FIG. 4 is a schematic cross-sectional view of another embodiment of a color filter 100a, which includes the substrate 110, the light blocking layer 120, the barrier wall 130, the first color conversion layer 140, the second color conversion layer 150, and the planarization layer 170.

The substrate 110 has the first through third pixel regions C1 through C3 that are separated from each other. The first color conversion layer 140 is over the first pixel region C1 and converts incident light Lb to light Lr of the first color. The second color conversion layer 150 is over the second pixel region C2 and converts the incident light Lb to the light Lg of the second color. The barrier wall 130 is over the substrate 110 to define the first through third pixel regions C1 through C3, and is between the first and second pixel regions C1 and C2 and between the second and third pixel regions C2 and C3. The light blocking layer 120 is continuously provided over the bottom surface of the barrier wall 130, which faces the substrate 110, and the side surface of the barrier wall 130. The planarization layer 170 may be over the substrate 110 to cover the light blocking layer 120, the barrier wall 130, the first color conversion layer 140, and the second color conversion layer 150.

The substrate 110, the light blocking layer 120, the barrier wall 130, the first color conversion layer 140, the second color conversion layer 150, and the planarization layer 170 may be those corresponding to the ones in FIGS. 1 and 2, with the following possible exceptions.

Referring to FIG. 4, the planarization layer 170 is over the third pixel region C3 without a color conversion layer over the substrate 110. The planarization layer 170 may include, for example, a transparent organic material having light transmissibility. Accordingly, incident light Lb may be externally emitted through the third pixel region C3 of substrate 110. The incident light Lb may be, for example, a third color, e.g., blue.

The light Lr of the first color may be emitted through the first pixel region C1, the light Lg of the second color may be emitted through the second pixel region C2, and the incident light Lb (e.g., blue light) may be emitted through the third pixel region C3. A display apparatus including the color filter 100a may therefore display a color image.

According to one embodiment, a band-pass filter layer that selectively transmits incident light Lb may be over the third pixel region C3. The band-pass filter layer may be, for example, the same as the band-pass filter layer 145 in FIG. 2. When a band-pass filter layer is not provided and light Lr and/or light Lg are included, light Lr and/or light Lg may be emitted through the third pixel region C3. In this case, not only the incident light Lb (e.g., blue light), but also light Lr and/or light Lg are emitted. Thus, color purity in the third pixel region C3 may be reduced, thereby reducing color reproducibility. The band-pass filter layer may selectively transmit incident light Lb (e.g., blue light), such that only blue light is emitted from the third pixel region C3, thereby increasing color purity and color reproducibility.

Figure 5:
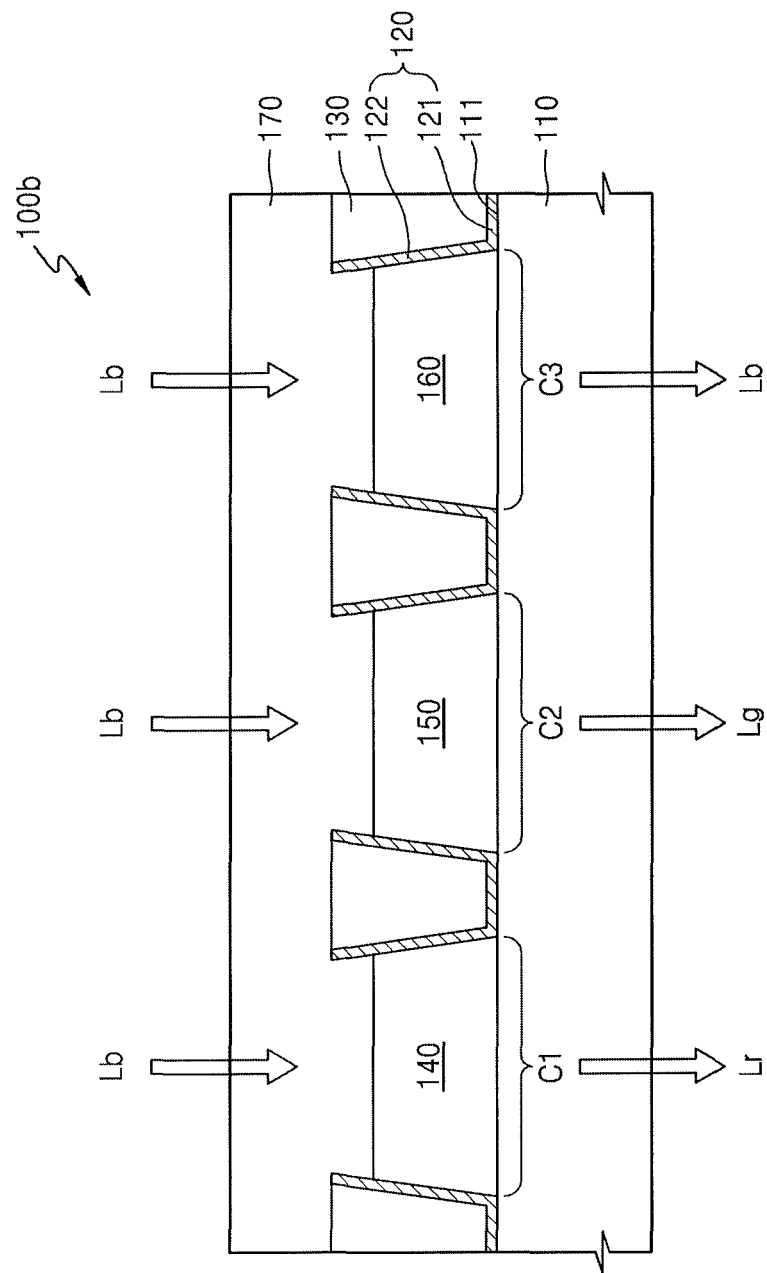
FIG. 5 illustrates another embodiment of a color filter.

FIG. 5 illustrates another embodiment of a color filter 100b which includes the substrate 110, the light blocking layer 120, the barrier wall 130, the first color conversion layer 140, the second color conversion layer 150, a penetration layer 160, and the planarization layer 170.

The substrate 110 has the first through third pixel regions C1 through C3 that are separated from each other. The first color conversion layer 140 is above the first pixel region C1 and converts incident light Lb to light Lr of the first color. The second color conversion layer 150 is above the second pixel region C2 and converts incident light Lb to light Lg of the second color. The barrier wall 130 is above the substrate 110 to define the first through third pixel regions C1 through C3, and is between the first and second pixel regions C1 and C2 and between the second and third pixel regions C2 and C3. The light blocking layer 120 is continuously provided above the bottom surface of the barrier wall 130, which faces the substrate 110, and the side wall of the barrier wall 130. The penetration layer 160 does not convert the color of incident light Lb, but transmits the incident light Lb. The planarization layer 170 may be above the substrate 110 to cover the light blocking layer 120, the barrier wall 130, the first color conversion layer 140, the second color conversion layer 150, and the penetration layer 160.

Since the substrate 110, the light blocking layer 120, the barrier wall 130, the first color conversion layer 140, the second color conversion layer 150, and the planarization layer 170 may correspond to those in FIGS. 1 and 2, with the following possible exceptions.

Referring to FIG. 5, the penetration layer 160 is above the third pixel region C3 of the substrate 110 and transmits the incident light Lb without converting the color of incident light Lb. The penetration layer 160 may include, for example, a transparent organic material having light trans-missibility. The penetration layer 160 may include scattered particles that scatter incident light Lb without color conversion. Accordingly, incident light Lb of the third color (e.g., blue) may be externally emitted through the third pixel region C3 of the substrate 110.

The penetration layer 160 may include a band-pass filter layer that selectively transmits incident light Lb. The band-pass filter layer may be directly provided on the substrate 110. The band-pass filter layer blocks light Lr and/or light Lg that may be in the incident light Lb from being emitted through the third pixel region C3. Thus, only the incident light Lb (e.g., blue light) is emitted through the third pixel region C3, thereby increasing color purity and color reproducibility.

The light Lr of the first color (e.g., red light) may be emitted through the first pixel region C1, light Lg of the second color (e.g., green light) may be emitted through the second pixel region C2, and incident light Lb (e.g., blue light) may be emitted through the third pixel region C3. Accordingly, a display apparatus including the color filter 100b may display a color image.

Figure 6:
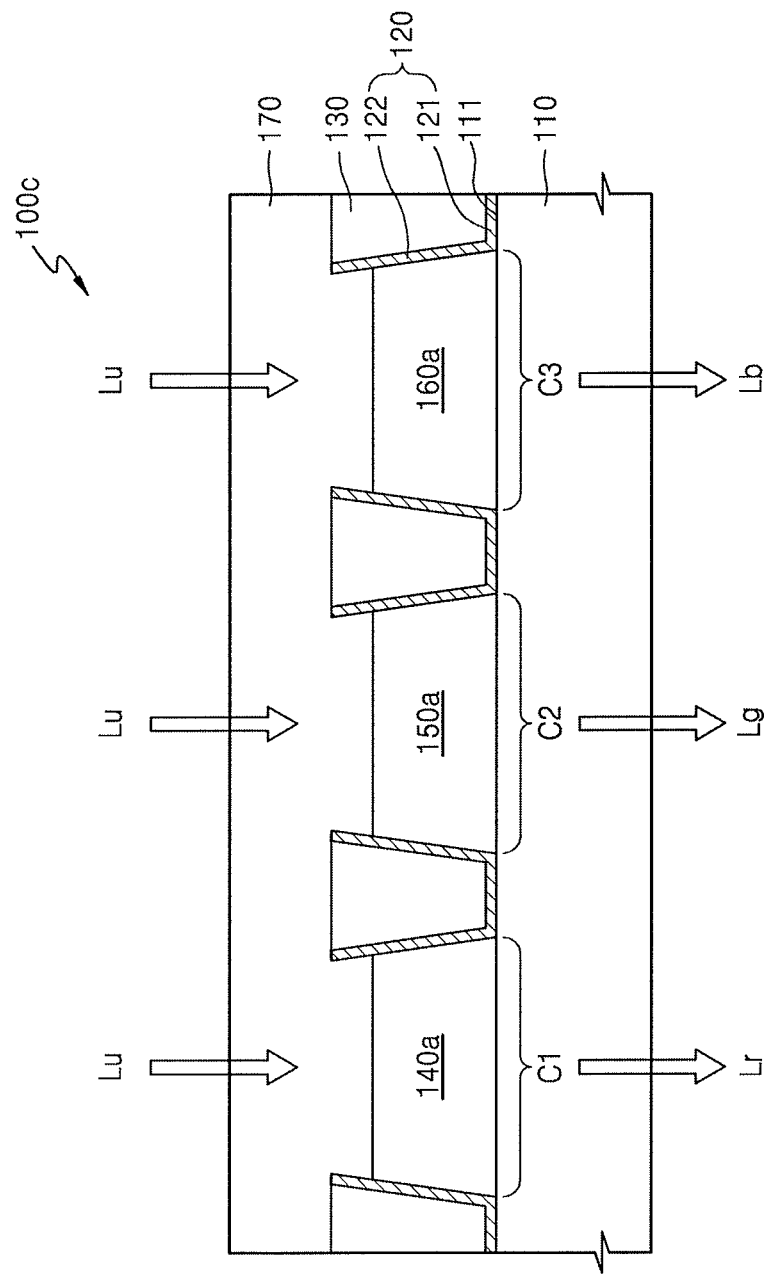
FIG. 6 illustrates another embodiment of a color filter.

FIG. 6 illustrates another embodiment of a color filter 100c which includes the substrate 110, the light blocking layer 120, the barrier wall 130, a first color conversion layer 140a, a second color conversion layer 150a, a third color conversion layer 160a, and the planarization layer 170.

The substrate 110 has the first through third pixel regions C1 through C3 that are separated from each other. The first color conversion layer 140a is over the first pixel region C1 and converts incident UV light Lu to light Lr of the first color. The second color conversion layer 150a is over the second pixel region C2 and converts the incident UV light Lu to light Lg of the second color. The third color conversion layer 160a is over the third pixel region C3 and converts the incident UV light Lu to light Lb of the third color. The barrier wall 130 is over the substrate 110 to define the first through third pixel regions C1 through C3, and is between the first and second color conversion layers 140a and 150a and between the second and third color conversion layers 150a and 160a. The light blocking layer 120 is continuously provided over the bottom surface of the barrier wall 130, which faces the substrate 110, and the side surface of the barrier wall 130. The planarization layer 170 may be over the substrate 110 to cover the light blocking layer 120, the barrier wall 130, the first color conversion layer 140a, the second color conversion layer 150a, and the third color conversion layer 160a.

Since the substrate 110, the light blocking layer 120, the barrier wall 130, and the planarization layer 170 may correspond to those in FIGS. 1 and 2, with the following possible exceptions.

The first color conversion layer 140a converts incident UV light Lu to light Lr of the first color, for example, red light. The first color conversion layer 140a may include a first quantum-dot color conversion layer including photo-sensitive resin in which a first quantum dot and scattered particle are dispersed. The first quantum dot emits light Lr by being excited by the incident UV light Lu. The first quantum dot may emit the light Lr having a longer wavelength band than the wavelength of the incident UV light Lu. The first quantum dot may include one of nano-crystals from among Si-based nano-crystals, II-VI group-based compound semiconductor nano-crystals, III-V group-based compound semiconductor nano-crystals, IV-VI group-based compound semiconductor nano-crystals, or a mixture thereof.

The first color conversion layer 140a may further include a UV light blocking filter layer reflecting incident UV light Lu between the first quantum-dot color conversion layer and the substrate 110. According to one embodiment, the first color conversion layer 140*a* may further include a first band-pass filter layer that selectively transmits the light Lr between the first quantum-dot color conversion layer and the substrate 110.

The second color conversion layer 150*a* converts incident UV light Lu to light Lg of the second color, for example, green light. The second color conversion layer 150*a* may include a second quantum-dot color conversion layer including photosensitive resin in which a second quantum dot and a scattered particle are dispersed. The second quantum dot emits light Lg by being excited by incident UV light Lu. The second quantum dot may emit light Lg having a longer wavelength band than the wavelength of incident UV light Lu. The second quantum dot may include one of nano-crystals from among Si-based nano-crystals, II-VI group-based compound semiconductor nano-crystals, III-V group-based compound semiconductor nano-crystals, IV-VI group-based compound semiconductor nano-crystals, or a mixture thereof.

The second color conversion layer 150*a* may further include a UV light blocking filter layer reflecting incident UV light Lu between the second quantum-dot color conversion layer and the substrate 110. According to one embodiment, the second color conversion layer 150*a* may further include a second band-pass filter layer selectively transmitting light Lg between the second quantum-dot color conversion layer and the substrate 110.

The third color conversion layer 160*a* converts incident UV light Lu to light Lb, for example, blue light. The third color conversion layer 160*a* may include a third quantum-dot color conversion layer including photosensitive resin in which a third quantum dot and a scattered particle are dispersed. The third quantum dot emits the light Lb by being excited by incident UV light Lu. The third quantum dot may emit the light Lb having a longer wavelength band than the wavelength of the incident UV light Lu. The third quantum dot may include one of nano-crystals from among Si-based nano-crystals, II-VI group-based compound semiconductor nano-crystals, III-V group-based compound semiconductor nano-crystals, IV-VI group-based compound semiconductor nano-crystals, or a mixture thereof.

The third color conversion layer 160*a* may further include a UV light blocking filter layer reflecting incident UV light Lu between the third quantum-dot color conversion layer and the substrate 110. According to another embodiment, the third color conversion layer 160*a* may further include a third band-pass filter layer selectively transmitting light Lg between the third quantum-dot color conversion layer and the substrate 110.

The first through third quantum dots may be formed, for example, of the same material. The size of a quantum dot for sufficiently inducing surface Plasmon resonance tends to increase as the wavelength of emitted light increases. Accordingly, the size of the first quantum dot may be larger than the size of the second quantum dot. The size of the second quantum dot may be larger than the size of the third quantum dot. The size of the third quantum dot may be larger than the size of the scattered particle. The scattered particles may scatter incident UV light Lu without changing the wavelength of the incident UV light Lu.

The light Lr of the first color (e.g., red light) may be emitted through the first pixel region C1. The light Lg of the second color (e.g., green light) may be emitted through the second pixel region C2. The light Lb of the third color (e.g., blue light) may be emitted through the third pixel region C3. Accordingly, a display apparatus including the color filter 100*c* may display a color image.

Figure 7:
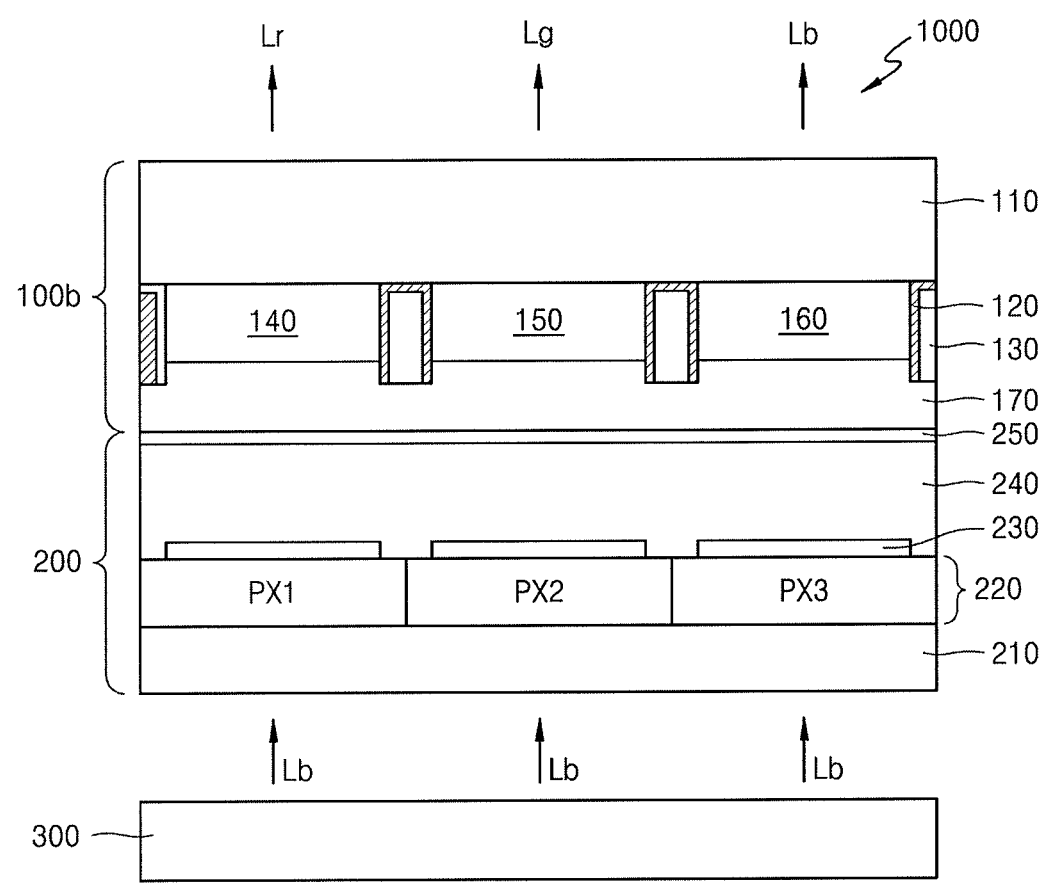
FIG. 7 illustrates an embodiment of a display apparatus.

FIG. 7 is a cross-sectional view of an embodiment of a display apparatus 1000 which includes a backlight apparatus 300, a liquid crystal display panel 200, and the color filter 100*b*. The color filter 100*b* may be the one illustrated in FIG. 5.

The backlight apparatus 300 may provide light for forming an image on the liquid crystal display panel 200. The backlight apparatus 300 may include a light source emitting light Lb of the third color, e.g., blue light. According to one embodiment, the backlight apparatus 300 may include a light source emitting UV light. In this case, the color filter 100*c* of FIG. 6 may be used instead of the color filter 100*b*.

The liquid crystal display panel 200 includes a lower substrate 210, a pixel circuit unit 220 above the lower substrate 210, a pixel electrode 230, a liquid crystal layer 240, and a common electrode 250. The pixel circuit unit 220 includes first through third pixels PX1 to PX3. Each of the first through third pixels PX1 through PX3 controls the pixel electrode 230 thereabove.

The color filter 100*b* externally emits light Lr and light Lg by partially converting the color of light Lb that is emitted from the backlight apparatus 300 and penetrates through the liquid crystal display panel 200. Thus, the light Lb may be externally emitted without experiencing a change in color.

The lower substrate 210 may be formed, for example, of glass or a transparent plastic material. In one embodiment, a lower polarizing plate for transmitting only light of certain polarization, from among light emitted from the backlight apparatus 300, may be provided at a bottom surface of the lower substrate 210. The lower polarizing plate may be, for example, a polarizing plate transmitting only light that is linearly polarized in a first direction.

The pixel circuit unit 220 may include a plurality of thin-film transistors, and a gate wire and a data wire for respectively applying a gate signal and a data signal to each of the thin-film transistors. The pixel electrode 230 may be electrically connected to a source or drain electrode of the thin-film transistor at the pixel circuit unit 220 in order to receive a data voltage.

The common electrode 250 may be over the planarization layer 170. An upper polarizing plate may be between the planarization layer 170 and the common electrode 250. The upper polarizing plate may be a polarizing plate transmitting light linearly polarized in a second direction, that is perpendicular to the first direction. In one embodiment, both of the upper and lower polarizing plates may transmit light of the same polarization.

The liquid crystal layer 240 is between the pixel electrode 230 and the common electrode 250. An arrangement of liquid crystal molecules in the liquid crystal layer 240 is adjusted according to a voltage applied between the pixel electrode 230 and the common electrode 250. For example, a region of the liquid crystal layer 240 between the pixel electrode 230 and the common electrode 250 may be controlled according to the voltage applied between the pixel electrode 230 and the common electrode 250. Thus, the liquid crystal layer 240 is controlled to be in a mode (on) changing polarization of incident light or in a mode (off) not changing polarization of incident light. Also, the degree of changing polarization of incident light is adjusted, and thus an intermediate gray scale is expressible.

The light Lb controlled by the liquid crystal layer 240 above the first pixel PX1 is converted to light Lr through the first color conversion layer 140 and externally emitted through the substrate 110. The light Lb controlled by the liquid crystal layer 240 above the second pixel PX2 is converted to light Lg through the second color conversion layer 150 and externally emitted through the substrate 110. The light Lb controlled by the liquid crystal layer 240 above the third pixel PX3 is externally emitted through the substrate 110 without color conversion, through the penetration layer 160.

The color filter 100*b* includes the first through third pixel regions C1 through C3 for forming different colors, and the barrier wall 130 defining the first through third pixel regions C1 through C3. The color filter 100*b* includes the light blocking layer 120 continuously provided above the bottom surface of the barrier wall 130, which faces the substrate 110, and the side surface of the barrier wall 130.

Referring to FIG. 5, the first through third pixel regions C1 through C3 may emit red, green, and blue, respectively. The first color conversion layer 140 converts light Lb to light Lr and may be provided in the first pixel region C1. The second color conversion layer 150 converts light Lb to light Lg and may be provided in the second pixel region C2. The penetration layer 160 that transmits light Lb is in the third pixel region C3.

An image is displayed as light Lb emitted from the backlight apparatus 300 passes through the liquid crystal display panel 200 and is incident on the color filter 100*b*, after being turned on/off according to a pixel region based on image information, and then is converted to light Lr, light Lg, and light Lb.

Since the light blocking layer 120 and the barrier wall 130 are between the first color conversion layer 140, the second color conversion layer 150, and the penetration layer 160, color mixture is prevented to thereby increase color reproducibility. Also, light efficiency is increased, thereby reducing power consumption.

In FIG. 7, the liquid crystal display panel 200 is between the backlight apparatus 300 and the color filter 100*b*. In one embodiment, the color filter 100*b* may be between the backlight apparatus 300 and the liquid crystal display panel 200. Also, in FIG. 7, the color filter 100*b* of FIG. 5 is turned over and provided above the liquid crystal display panel 200. In one embodiment, the color filter 100*b* may not be turned over and the substrate 110 may be above the liquid crystal display panel 200.

Figure 8:
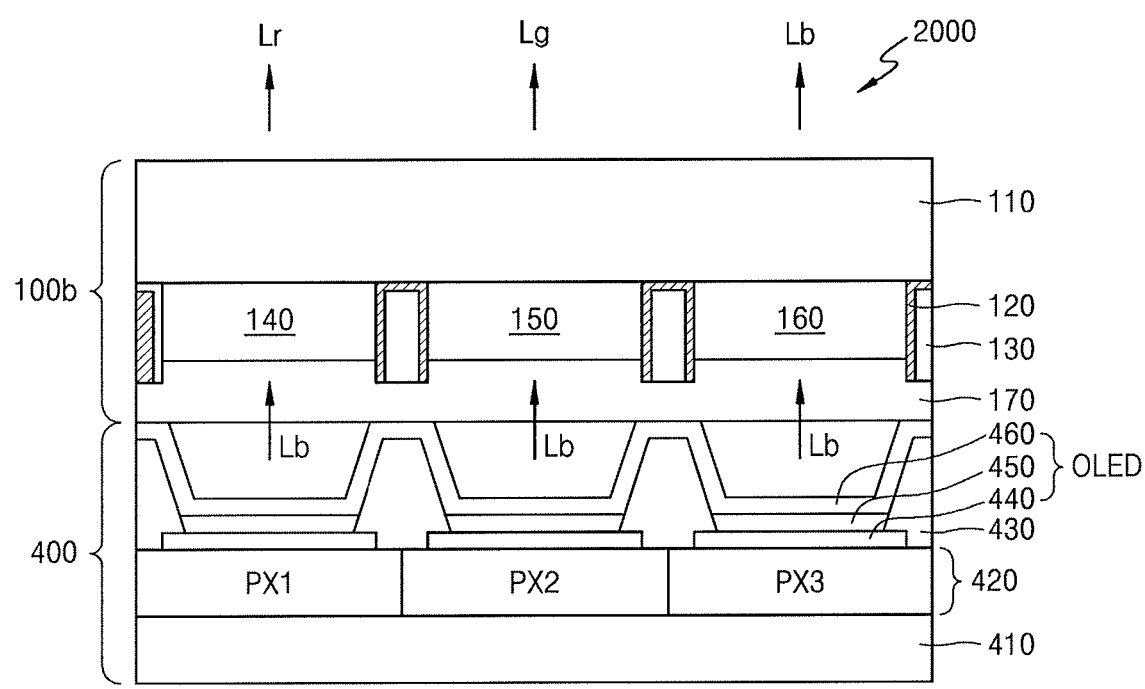
FIG. 8 illustrates another embodiment of a display apparatus.

FIG. 8 is a cross-sectional view of an embodiment of a display apparatus 2000 which includes an organic light-emitting display panel 400 and the color filter 100*b*. The organic light-emitting display panel 400 includes the first to third pixels PX1 to PX3, and includes organic light-emitting devices (OLEDs) respectively controlled by the first through third pixels PX1 through PX3. Each of the OLEDs may emit light Lb (e.g., blue light) in an amount controlled by the first to third pixels PX1 to PX3.

The color filter 100*b* may externally emit light Lr and light Lg by partially converting a color of light Lb emitted from the OLED. The light Lb may be externally emitted without color conversion.

According to one embodiment, the OLED may emit UV light. In this case, the color filter 100*c* of FIG. 6 may be used instead of the color filter 100*b*.

A substrate 410 may be formed, for example, of a transparent material, e.g., glass, a metal, or an organic material.

A pixel circuit layer 420 including the first to third pixels PX1 to PX3 is over the substrate 410. Each of the first to third pixels PX1 to PX3 includes a plurality of thin-film transistors and one or more storage capacitors, and signal lines and a power supply line for transmitting signals and a driving voltage to the first to third pixels PX1 to PX3 are in the pixel circuit layer 420, in addition to the first to third pixels PX1 to PX3.

The thin-film transistor may include a semiconductor layer, a gate electrode, a source electrode, and a drain electrode. The semiconductor layer may include, for example, amorphous silicon or polycrystalline silicon. The semiconductor layer may include an oxide semiconductor. The semiconductor layer may include a channel region, and source and drain regions doped with impurities.

Pixel electrodes 440 are over the pixel circuit layer 420. The pixel electrode 440 may be connected to the source and drain electrode of the thin-film transistor. The pixel electrode 440 is exposed through an opening of a pixel defining layer 430, and an edge of the pixel electrode 440 may be covered by the pixel defining layer 430.

An intermediate layer 450 is over the pixel electrodes 440 exposed by the pixel defining layer 430. The intermediate layer 450 includes an organic emission layer formed, for example, of a low molecular organic material or a high molecular organic material. The intermediate layer 450 may further selectively include at least one of functional layers, such as a hole transport layer (HTL), a hole injection layer (HIL), an electron transport layer (ETL), or an electron injection layer (EIL), in addition to the organic emission layer.

A counter electrode 460 covers the intermediate layer 450 and the pixel defining layer 430. The counter electrode 460 may be a transparent or semi-transparent electrode. The counter electrode 460 may include, for example, a metal having a low work function. The counter electrode 460 may include a transparent conductive oxide (TCO).

The pixel electrode 440, the intermediate layer 450, and the counter electrode 460 form the OLED. The light Lb emitted from the OLED controlled by the first pixel PX1 is converted to light Lr through the first color conversion layer 140 and is externally emitted through the substrate 110. The light Lb emitted from the OLED controlled by the second pixel PX2 is converted to light Lg through the second color conversion layer 150 and is externally emitted through the substrate 110. The light Lb emitted from the OLED, as controlled by the third pixel PX3, is externally emitted through the substrate 110, without color conversion, through the penetration layer 160.

The color filter 100*b* includes the first through third pixel regions C1 through C3 for forming different colors, and the barrier wall 130 defining the first through third pixel regions C1 through C3. The color filter 100*b* includes the light blocking layer 120 continuously provided over the bottom surface of the barrier wall 130, which faces the substrate 110, and the side surface of the barrier wall 130.

As described above with reference to FIG. 5, the first to third pixel regions C1 to C3 may emit red, green, and blue, respectively. The first color conversion layer 140 converts light Lb to light Lr and is in the first pixel region C1. The second color conversion layer 150 converts light Lb to light Lg and is in the second pixel region C2. The penetration layer 160 transmits light Lb and is in the third pixel region C3.

A color image is displayed as light Lb emitted from the organic light-emitting display panel 400 is incident on the color filter 100*b* and then is converted to light Lr, light Lg, and light Lb.

Since the light blocking layer 120 and the barrier wall 130 are between the first color conversion layer 140, the second color conversion layer 150, and the penetration layer 160, color mixture is prevented to thereby increase color reproducibility. Also, light efficiency is increased, thereby reducing power consumption.

In FIG. 7, the color filter 100b of FIG. 5 is turned over and provided above the organic light-emitting display panel 400. In one embodiment, the color filter 100b may not be turned over and the substrate 110 may be above the organic light-emitting display panel 400.

In accordance with one or more of the aforementioned embodiments, a color conversion layer is formed via an inkjet coating method. Thus, the manufacturing processes may be simplified. Also, a reflection layer may be formed on a side surface of a barrier wall, while the barrier wall is formed between adjacent color conversion layers. As a result, color mixture between the adjacent color conversion layers may be prevented, and also light efficiency may increase by the reflection layer. Accordingly, a display apparatus that is easily to manufacture and that has increased color reproducibility may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A color filter, comprising:
a substrate including a first pixel region spaced from a second pixel region;
a first color conversion layer, on the first pixel region, to convert incident light to light of a first color;
a second color conversion layer, on the second pixel region, to convert the incident light to light of a second color;
a barrier wall between the first color conversion layer and the second color conversion layer over the substrate; and
a light blocking layer extending continuously on a bottom surface and a side surface of the barrier wall, the bottom surface facing the substrate, wherein the light blocking layer blocks the incident light, the light of the first color emitted from the first color conversion layer, and the light of the second color emitted from the second color conversion layer.

2. The color filter as claimed in claim 1, wherein the light blocking layer includes:
a black matrix layer between the barrier wall and the substrate, and
a reflection layer between the barrier wall and the first and second color conversion layers.

3. The color filter as claimed in claim 2, wherein the reflection layer includes a same material as the black matrix layer and continuously extends from the black matrix layer.

4. The color filter as claimed in claim 1, wherein:
a cross-section of the barrier wall has an inverse-tapered shape, and
a width of the inverse-tapered shape increases in a direction leading away from the substrate.

5. The color filter as claimed in claim 1, wherein:
the first color conversion layer includes first quantum dots to emit the light of the first color when excited by the incident light, and
the second color conversion layer includes second quantum dots to emit the light of the second color when excited by the incident light.

6. The color filter as claimed in claim 5, wherein:
the first color conversion layer includes:
a first quantum-dot color conversion layer that includes the first quantum dots, and
a first color filter layer to reflect the incident light, the first color filter layer between the substrate and the first quantum-dot color conversion layer, and
the second color conversion layer includes:
a second quantum-dot color conversion layer that includes the second quantum dots, and
a second color filter layer to reflect the incident light, the second color filter layer between the substrate and the second quantum-dot color conversion layer.

7. The color filter as claimed in claim 6, wherein:
the first color filter layer is to selectively transmit the light of the first color emitted from the first quantum-dot color conversion layer, and
the second color filter layer is to selectively transmit the light of the second color emitted from the second quantum-dot color conversion layer.

8. The color filter as claimed in claim 6, wherein the first color conversion layer includes a band-pass filter layer to selectively transmit the incident light, the band-pass filter layer over the first quantum-dot color conversion layer.

9. The color filter as claimed in claim 1, wherein:
the incident light is blue light or ultraviolet light,
the first color is red, and
and the second color is green.

10. The color filter as claimed in claim 1, wherein:
the light blocking layer includes a plurality of layers continuously stacked on the bottom surface and the side surface of the barrier wall, wherein a portion of the light blocking layer is between the substrate and the bottom surface of the barrier wall, and
at least one of the layers includes a continuously extended metal layer.

11. The color filter as claimed in claim 1, wherein the light blocking layer includes a first layer, a second layer on the first layer, and a third layer on the second layer, wherein the first and third layers include a transparent metal oxide, and the second layer includes a metal.

12. The color filter as claimed in claim 1, wherein:
the substrate includes a third pixel region spaced apart from the first and second pixel regions, and
the color filter includes a penetration layer on the third pixel region, the color filter to transmit the incident light.

13. The color filter as claimed in claim 1, wherein:
the substrate includes a third pixel region spaced apart from the first and second pixel regions, and
the color filter includes a third color conversion layer on the third pixel region, the color filter to convert the incident light to light of a third color.

14. The color filter as claimed in claim 1, wherein each of thicknesses of the first and second color conversion layers are less than or equal to a height from the substrate to a top surface of the barrier wall.

15. The color filter as claimed in claim 1, wherein the first color conversion layer includes a first quantum-dot color conversion layer including first quantum dots, scattered particles and a photosensitive resin layer, the first quantum dots and scattered particles being dispersed in the photosensitive resin layer.

16. A method for manufacturing a color filter, the method comprising:
    forming a sacrificial layer exposing a light blocking region between a first pixel region and a second pixel region, the first and second pixel regions spaced from each other over a substrate;
    forming a reflection material layer over the substrate to cover the light blocking region of the substrate and the sacrificial layer, and forming a trench corresponding to the light blocking region and limited by the reflection material layer;
    forming an organic material pattern embedding the trench;
    etching the reflection material layer using the organic material pattern as a mask to expose the sacrificial layer, and forming a reflection layer over the light blocking region of the substrate and a side surface of the sacrificial layer;
    exposing the first and second pixel regions of the substrate by removing the sacrificial layer;
    forming, on the first pixel region, a first color conversion layer to convert incident light thereon to light of a first color; and
    forming, on the second pixel region, a second color conversion layer to convert the incident light thereon to light of a second color, wherein the light blocking layer blocks the incident light, the light of the first color emitted from the first color conversion layer, and the light of the second color emitted from the second color conversion layer.

17. The method as claimed in claim 16, wherein forming the first and second color conversion layers are performed using an inkjet coating method.

18. The method as claimed in claim 16, further comprising:
    forming a barrier wall embedding the trench limited by the reflection layer, wherein forming the barrier wall includes removing part of the organic material pattern.

19. The method as claimed in claim 16, wherein the trench has a width that increases in a direction leading away from the substrate.

20. The method as claimed in claim 16, wherein forming the reflection material layer includes continuously stacking a plurality of layers on the substrate.

21. A display apparatus, comprising:
    a display including first and second pixels; and
    a color filter over the display and including first and second pixel regions respectively overlapping the first and second pixels, wherein the color filter includes:
    a substrate including the first and second pixel regions;
    a first color conversion layer, on the first pixel region of the substrate, to convert incident light to light of a first color;
    a second color conversion layer, on the second pixel region of the substrate, to convert the incident light to light of a second color;
    a barrier wall between the first color conversion layer and the second color conversion layer over the substrate; and
    a light blocking layer extending continuously on a bottom surface of the barrier wall and a side surface of the barrier wall, the bottom surface facing the substrate, wherein the light blocking layer blocks the incident light, the light of the first color emitted from the first color conversion layer, and the light of the second color emitted from the second color conversion layer.

22. The display apparatus as claimed in claim 21, wherein the display includes a backlight and a liquid crystal display panel over the backlight.

23. The display apparatus as claimed in claim 21, wherein each of the first and second pixels includes an organic light-emitting device.

* * * * *